United States Patent [19]

Horiuchi et al.

[11] Patent Number: 4,963,713
[45] Date of Patent: Oct. 16, 1990

[54] COOLING OF A PLASMA ELECTRODE SYSTEM FOR AN ETCHING APPARATUS

[75] Inventors: Takao Horiuchi, Tokyo; Izumi Arai, Yokohama; Yoshifumi Tahara, Yamato, all of Japan

[73] Assignee: Tokyo Electron Limited, Tokyo, Japan

[21] Appl. No.: 298,892

[22] Filed: Jan. 19, 1989

[30] Foreign Application Priority Data

Jan. 20, 1988 [JP] Japan .................................. 63-10358
Feb. 15, 1988 [JP] Japan .................................. 63-32099

[51] Int. Cl.$^5$ .............................................. B23K 9/00
[52] U.S. Cl. ........................... 219/121.43; 219/121.41; 219/121.49; 219/21.54; 156/345; 156/646
[58] Field of Search .................... 219/121.43, 121.49, 219/121.48, 74, 75, 121.55, 121.54, 121.41; 156/643, 646, 345; 427/34

[56] References Cited

U.S. PATENT DOCUMENTS

| | | | |
|---|---|---|---|
| 4,125,754 | 11/1978 | Wasserman et al. | 219/121.49 |
| 4,367,114 | 1/1983 | Steinberg et al. | 219/121.43 |
| 4,371,775 | 2/1983 | Mihara et al. | 219/121.49 |
| 4,547,648 | 10/1985 | Longeway | 219/121.43 |
| 4,659,899 | 4/1987 | Welkic et al. | 219/121.49 |
| 4,800,251 | 1/1989 | Matsuoka | 219/121.4 |

FOREIGN PATENT DOCUMENTS

53-49398 5/1978 Japan .
59-19328 1/1984 Japan .
61-8927 1/1986 Japan .

OTHER PUBLICATIONS

IBM Technical Disclosure Bulletin, vol. 26, No. 7B, Dec. 1983.

Primary Examiner—M. H. Paschall
Attorney, Agent, or Firm—Oblon, Spivak, McClelland, Maier & Neustadt

[57] ABSTRACT

An etching apparatus has a method for stopping the generation of plasma responsive to the detection of poor cooling of a block electrode, which is provided with an electrode, to prevent the electrode from being cracked because of the thermal expansion of both electrodes so as to reduce the times of electrode exchange. The present invention also provides an etching method including a process of controlling the flow rate and pressure of a cooling gas supplied to a clearance between a substrate to be processed and a block electrode on which the substrate is mounted, so as to enable uniform etching to be applied to the substrate.

4 Claims, 5 Drawing Sheets

COOLING OF A PLASMA ELECTRODE SYSTEM FOR AN ETCHING APPARATUS

BACKGROUND OF THE INVENTION

1. Field of the Invention

The present invention relates to an etching apparatus.

2. Description of the Related Art

The plasma etching apparatus which uses reaction components in gas plasma has attracted attention these days as a means for etching various kinds of thin films. This etching apparatus can make the complicated manufacturing process of semiconductor elements simple and automatic. Further, it can create semiconductor elements of micropattern with high precision.

According to this etching apparatus, a block electrode made of aluminium is located at the lower portion of an air-tight container which is communicated with a vacuum means. Another block electrode made of aluminium and provided with an electrode made of amorphous carbon is located above the lower block electrode in the air-tight container. RF power source is connected to the electrode made of amorphous carbon and the upper block electrode made of aluminium. A substrate to be treated, that is, a semiconductor wafer is mounted on the lower block electrode made of aluminium. Power is applied to the RF power source and to the electrodes, while a desired processing gas is supplied between the upper and lower block electrodes at the same time. The processing gas is thus changed to plasma by the electric power applied. The surface of the semiconductor wafer is etched by the processing gas which has been changed to plasma.

In the case of the above-mentioned plasma etching apparatus, however, electric power is applied to the electrodes to change the processing gas to plasma. The semiconductor wafer is heated by energy created at the time when the processing gas is changed to plasma. The resist layer on the semiconductor wafer is damaged by this heat. It is therefore needed that the semiconductor wafer is cooled while it is being etched. Preliminarily-opened Japanese patent application Sho No. 61-20622, for example, discloses a technique of cooling the semiconductor wafer and the like. According to this technique, the semiconductor wafer is mounted on the electrode while it is pressed along its peripheral rim. A cooling gas is supplied between the semiconductor wafer and the electrode to spread from the center of the wafer to the periphery thereof so as to cool the semiconductor wafer. The cooling gas is supplied, in this case, to the underside of the semiconductor wafer only to spread from the center of the wafer to the periphery thereof. Therefore, the pressure and flow rate of the cooling gas differ with different positions on the underside of the semiconductor wafer. The semiconductor wafer is thus sometimes lifted from the electrode to make smaller its area which is contacted with the electrode. This makes it impossible to apply uniform etching to the whole surface of the semiconductor wafer.

Electric power is applied to both of the block electrodes in the conventional plasma etching apparatus. The upper block electrode is heated to 150°–180° C. in this case. The electrode made of amorphous carbon and the upper block electrode provided with this amorphouscarbon-made electrode are expanded by heat. Amorphous carbon is different from aluminium in thermal expansion coefficient. This causes the amorphous-carbon-made electrode to be cracked.

Japanese Patent Publication Sho No. 62-48758 discloses a technique of cooling the electrodes to eliminate the above-mentioned drawback. According to this technique, electric power is applied to the block electrodes while the amorphous-carbon-made electrode is being cooled. This prevents the electrode from being cracked. When electric power is applied to the block electrodes while the electrode is not being cooled, however, the amorphous-carbon-made electrode is still cracked because of thermal expansion.

SUMMARY OF THE INVENTION

An object of the present invention is to provide an etching apparatus capable of applying uniform etching to a matter to be processed by controlling the pressure and flow rate of a cooling gas.

Another object of the present invention is to provide an etching apparatus capable of preventing the electrode from being cracked by thermal expansion to enhance its durability.

According to the present invention, there can be provided an etching apparatus wherein electrodes are arranged in a vacuum container, electric power is applied to both of the block electrodes to change a processing gas to plasma in the vacuum container, and a substrate mounted on the electrode to be process is etched by the processing gas which has been changed to plasma, said apparatus comprising a means for cooling the block electrodes, a means for detecting whether or not the block electrodes are cooled, and a means for stopping the generation of plasma, in response to a detection signal applied from the detector means, said signal representing that the block electrodes are not cooled to a desired extent.

It is preferable that the cooling means comprises a means for supplying a cooling gas to the substrate and the block electrode on which the substrate is mounted, and a means for controlling the flow rate and pressure of the cooling gas to keep them at desired values.

According to the etching apparatus of the present invention, the generation of plasma is stopped in response to the detection signal applied, when it is detected that the block electrodes are not cooled to the desired extent. This prevents the block electrodes from being abnormally heated by the electric power applied to the block electrodes to generate plasma. Even when the upper block electrode and its accompanying electrode are made of such materials that are quite different from each other in thermal expansion coefficient, therefore, the electrode is not cracked because of thermal expansion, thereby enhancing the durability of the etching apparatus.

The present invention is also intended to provide an etching method comprising mounting a substrate to be processed on one of block electrodes which are arranged in a vacuum container, supplying a cooling gas to the block electrode, on which the substrate to be processed is mounted, at predetermined flow rate and pressure, supplying a processing gas into the vacuum container, applying a predetermined electric power to the block electrodes to change the processing gas to plasma, and etching the substrate by the plasma of the processing gas.

A process of controlling the flow rate and pressure of the cooling gas may be included in the cooling gas supply process.

Further, the process of changing the processing gas to plasma may include a process of causing the electrodes to stop the generation of plasma when it is detected that the electrodes are not cooled to the desired extent.

According to the etching method of the present invention, the substrate to be processed is cooled by controlling the flow rate and pressure of the cooling gas which is supplied between the substrate and the block electrode on which the substrate is mounted. The temperature of the substrate is thus made equal at every point on the substrate. Etching is applied to the substrate while it is kept under this state, thereby enabling the uniformity of etching to be enhanced.

DETAILED DESCRIPTION OF THE PREFERRED EMBODIMENT

An embodiment of the present invention will be described.

Figure 1:
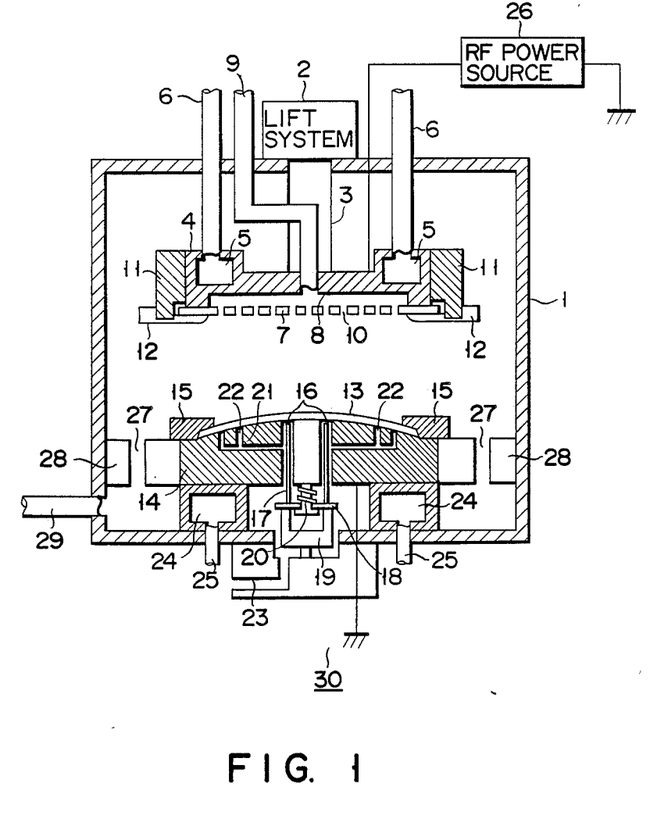
FIG. 1 is a sectional view showing an example of the etching apparatus according to the present invention.

FIG. 1 is a sectional view showing an example of the etching apparatus according to the present invention.

Block electrode 4 which can be lifted by lift system 2 is located at the upper portion of reaction container 1 made of conductive material such as aluminium and having a surface processed with anodized aluminum. Lift system 2 includes an air cylinder, a ball screw and connecting rod 3, and container 1 is made air-tight. Block electrode 4 is made of conductive material such as aluminium and its surface is processed with anodized aluminum. Block electrode 4 has a cooling means, which includes passage 5 extending through block electrode 4. Passage 5 is connected to a cooling device (not shown), which is located outside the reaction container 1, through pipes 6 and liquid such as water which has a certain temperature is circulated through pipes 6 and passage 5. The cooling means uses liquid as its cooling medium, but it may be a forced air cooling means which circulates cooled air, a natural air cooling means which uses radiating fins located adjacent to block electrode 4, or a electric cooling means which uses Peltier effect elements arranged in block electrode 4.

Upper electrode 7 made of amorphous carbon, for example, is located under block electrode 4 and it is electrically connected to the latter. A little space 8 is formed between upper electrode 7 and block electrode 4 and gas supply pipe 9 is communicated with this space 8. Reaction gas such as argon and freon is supplied from a gas supply source (not shown), which is located outside the reaction container 1, into space 8 through gas supply pipe 9. Upper electrode 7 is provided with plural holes 10 which allow the reaction gas in space 8 to flow into the inside of reaction container 1 through upper electrode 7. Insulating ring 11 encloses upper and block electrodes 7 and 4. Sealing ring 12 extends from the underside of insulating ring 11 to the peripheral rim of the underside of upper electrode 7. Sealing ring 12 is made of insulating material such as ethylene tetrafluoride resin in such a way that plasma can be generated to have substantially same radius as that of a substrate or semiconductor wafer etched.

Semiconductor wafer 13 is mounted on the surface of lower block electrode 14 which is opposed to upper electrode 7. Lower block electrode 14 is made of aluminium, for example, having its surface processed with anodized aluminum and it is made flat. The upper surface of lower block electrode 14 is curved (R) or convexed, sloping from its top down to its peripheral rim. This curved surface (R) is desired to form a so-called uniform loaded curve. An uniform etching is achieved by this curved surface (R). In the other words, the back side of semiconductor wafer 13 is contacted completely to electrode 14. Clamp ring 15 is arranged along the rim of lower block electrode 14. It is sized to contact the peripheral rim portion of semiconductor wafer 13 with the convexed surface of lower block electrode 14. It is made of aluminium, for example, having its surface processed with anodized aluminum and coated with insulating alumina. It is lifted and lowered by a lift system (not shown) to press semiconductor wafer 13 onto the lower block electrode 14 at a certain pressure.

Lower block electrode 14 is provided with four through-holes 16, for example, vertically passing through electrode 14. Lifter pin 17 is housed in each of through-holes 16. Lifter pin 17 is made of SUS and four lifter pins 17 are freely lifted and lowered together with plate 18 from which lifter pins 17 are erected and which is driven by lift system 19. When not driven by lift system 19, plate 18 is urged downward by coil spring 20. The top of each of lifter pins 17 is held lower than the upper surface of lower block electrode 14. Cooling gas flowing pipe 21 is connected to through-holes 16. It is also communicated with plural or sixteen openings 22 which are arranged on that portion of the upper surface of lower block electrode 14 which correspond to the peripheral rim portion of semiconductor wafer 13. Cooling gas introducing pipe 23 connected to a cooling gas supply source (not shown) is located under reaction container 1 to supply a cooling gas such as cooled helium gas to the underside of semiconductor wafer 13 through openings 22 and through-holes 16.

When electric power is applied to lower block electrode 14, electrode 14 is heated similarly to the case of upper electrode 7. A cooling system or passage 24 is thus provided, contacting the underside of lower block electrode 14. Pipes 25 connected to passage 24 is communicated with e.g. a liquid cooling device (not shown) to circulate cooling liquid or water through pipes 25 and passage 24. Lower block electrode 14 may be cooled by the forced air cooling system, natural air cooling system or electrical cooling system, as stated above about upper electrode 7. Lower block and upper electrodes 14 and 7 are electrically connected to RF power source 26.

Exhaust ring 28 provided with exhaust hole 27 is fitted between the side of lower block electrode 14 and the inner face of reaction container 1. Exhaust pipe 29 extending from one side of reaction container 1 under exhaust ring 28 is connected to an exhaust device (not shown) to exhaust gas from the inside of reaction container 1.

Etching apparatus 30 has the above-described arrangement.

Substrate or semiconductor wafer 13 to be processed is conveyed into reaction container 1 through a lock room (not shown) from a wafer cassette of a convey system (not shown). This conveying of semiconductor wafer 13 is achieved according to a predetermined program. Semiconductor wafer 13 is received in higher position than the position of electrode 14, by lifter pins 17 which have been lifted higher than the upper surface of lower block electrode 14 by lift system 19 through through-holes 16. When lifter pins 17 is lowered (or when electrode 14 is uppered), semiconductor wafer 13 is contacted with the upper surface of lower block electrode 14. Semiconductor wafer 13 is pressed against lower block electrode 14 at the peripheral rim portion thereof by clamp ring 15. And semiconductor wafer 13 is held along with electrode 14. The upper surface of lower block electrode 14 is curved (R) or convexed. Even when semiconductor wafer 13 is caused to have warp or flexure in the previous process, therefore, it can be reliably contacted with the upper surface of lower block electrode 14. Reaction container 1 is made airtight and vacuum to a desired extent. This process of making reaction container 1 vacuum may be previously carried out, using an auxiliary chamber, at the time when semiconductor wafer 13 is to be conveyed into reaction container 1. As a result, whole the back side surface of semiconductor wafer 13 is contacted uniformly to electrode 14 surface.

Block electrode 4 is then lowered by lift system 2 through connecting rod 3 to held upper electrode 7 and lower block electrode 14 separated from each other by a desired distance or several millimeters to generate plasma, for example. Reaction gas such as freon gas and argon gas is supplied from the gas supply source (not shown) to space 8 through gas supply pipe 9. The reaction gas supplied to space 8 flows to the surface of semiconductor wafer 13 through plural holes 10 in upper electrode 7. High frequency electric current is applied at the same time from RF power source 26 to upper electrode 7 and lower block electrode 14 to change the reaction gas to plasma. Semiconductor wafer 13 is etched by this plasma of the reaction gas. Upper electrode 7 and lower block electrode 14 are heated by the high frequency electric current applied. When upper electrode 7 is heated, it undergoes thermal expansion. Upper electrode 7 is made of amorphous carbon while block electrode 4 contacted with this upper electrode 7 is made of aluminium. Therefore, they are different from each other in thermal expansion coefficient and crack is caused in one of these electrodes 7 and 4. In order to prevent upper electrode 7 from being cracked, the cooling means (not shown) allows cooling water to flow into block electrode 4 through pipes 6 and passage 5 to cool upper electrode 7 indirectly.

When lower block electrode 14 is heated, the temperature of semiconductor wafer 13 is also raised. This may cause the resist pattern on the surface of semiconductor wafer 13 to be damaged. Similarly to the case of upper electrode 7, cooling water or the like is fed from the cooling means (not shown) into lower block electrode 14 through pipes 25 and passage 24. This cooling water is controlled to have a temperature of 20°–80° C. so as to enable semiconductor wafer 13 to be processed at a certain temperature. Semiconductor wafer 13 is also heated by the thermal energy of plasma. Semiconductor wafer 13 is therefore cooled in such a way that cooling gas such as helium gas is supplied from the cooling gas supply source (not shown) to the underside of semiconductor wafer 13 through gas introducing pipe 23, gas flowing pipe 21, plural or sixteen openings 22 along the peripheral rim of lower block electrode 14 and four through-holes 16 at the center of electrode 14. Openings 22 and through-holes 16 are closed this time by semiconductor wafer 13 but a slight clearance is left between semiconductor wafer 13 and the upper surface of lower block electrode 14. Helium gas is supplied into this clearance to cool semiconductor wafer 13.

Figure 2A:
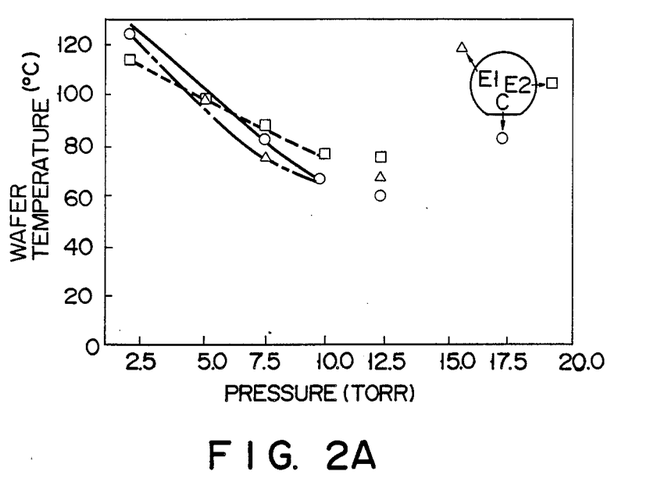
FIGS. 2A, 2B and 2C are graphs showing how the surface temperature of the semiconductor wafer changes when the flow rate and pressure of the cooling gas are changed in the etching apparatus shown in FIG. 1.
Figure 2B:
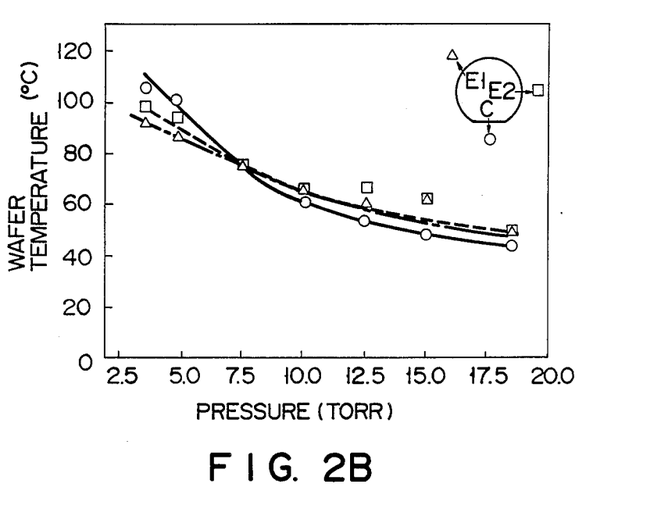
Figure 2C:
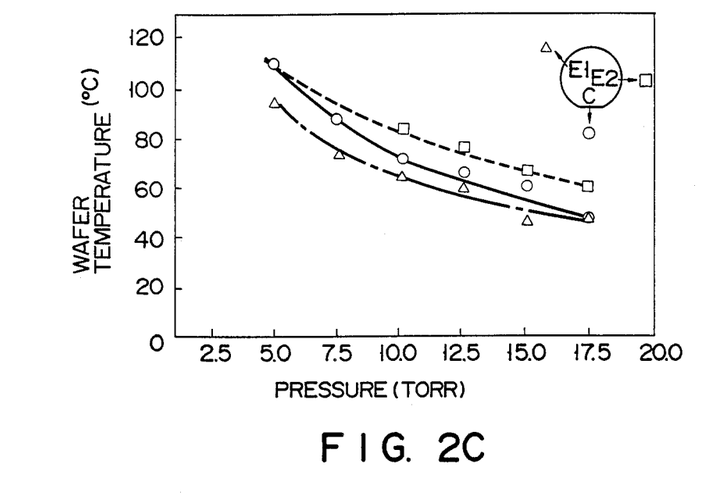

FIGS. 2A, 2B and 2C are intended to obtain optimum values about the pressure and flow rate of helium gas. It was assumed that the vacuum degree of reaction container 1 was 2.4 Torr, output of RF power source 26 500 W, flow rate of freon gas which served as the reaction gas was 80 cc/min., and flow rate of argon gas 500 cc/min. The flow rate of helium gas which served as the cooling gas was changed from 3 cc/min (FIG. 2A) to 5 cc/min (FIG. 2B) and 8 cc/min (FIG. 2C). Temperature was measured at center C and other two points $E_1$ and $E_2$ in the peripheral rim portion of semiconductor wafer 13. As shown in FIG. 2B, temperature became equal at points C, $E_1$ and $E_2$ on semiconductor wafer 13 when the flow rate of helium gas was 5 cc/min and the pressure thereof was 7.5 Torr. It is therefore understood that uniform etching can be applied to the surface of semiconductor wafer 13 when the flow rate and pressure of helium gas are these values.

Figure 3:
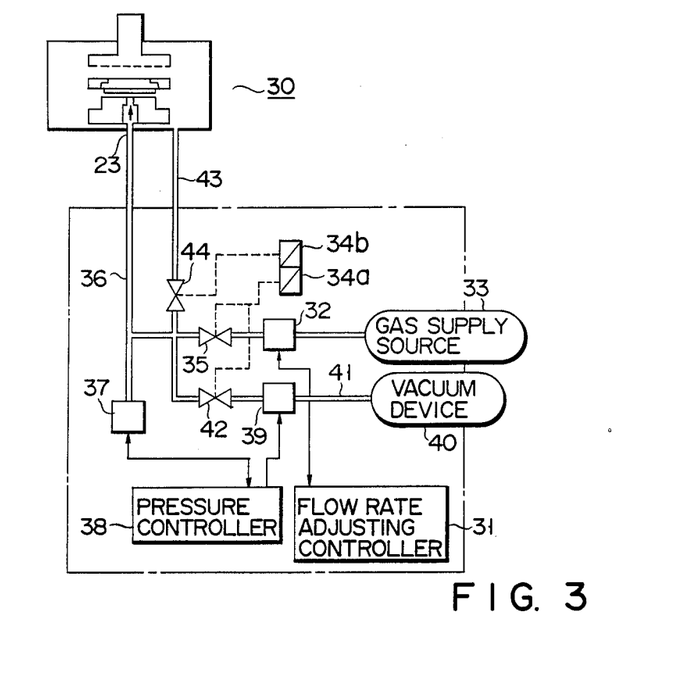
FIG. 3 shows a system for controlling the flow rate and pressure of the cooling gas in the etching apparatus shown in FIG. 1.

FIG. 3 shows an example of the control system for the cooling gas or helium gas. The flow rate of helium gas is adjusted to a desired value by flow rate adjusting controller 31 and flow rate adjuster 32 associated with flow rate adjusting controller 31 then automatically set helium gas, which is fed from gas supply source 33, to have this desired value of flow rate. Helium gas whose flow rate has been adjusted is supplied to the underside of semiconductor wafer 13 through valve 35, which is closed and opened by solenoid 34a, pipe 36 and gas introducing pipe 23 in lower block electrode 14. Pressure monitor or manometer 37 for detecting the pressure of flowing helium gas is attached to pipe 36. Pressure information detected is inputted to pressure controller 38. This pressure controller 38 closes and opens control valve 39 responsive to pressure information inputted. Control valve 39 is on pipe 41 connected to vacuum means 40 and it is connected to pipe 36 through valve 42 which is driven together with valve 35 by solenoid 34a. When this control valve 39 is driven, helium gas can be set to have the desired pressure.

Pipe 43 for making pressure same at the underside of semiconductor wafer 13 and in reaction container 1 after semiconductor wafer 13 is processed is arranged between reaction container 1 and pipe 36. Valve 44 which is driven by solenoid 34b is on pipe 43 and it is opened when pressure is to be made same at the underside of semiconductor wafer 13 and in reaction container 1. When valve 44 is opened, solenoids 34a and 34b are inverted to stop the supply of helium gas while to make pressure same at the underside of semiconductor wafer 13 and in reaction container 1.

The uniformity of etching can be enhanced when the pressure and flow rate of cooling gas supplied to the underside of semiconductor wafer 13 is controlled as described above.

Figure 4A:
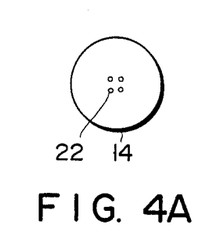
FIGS. 4A and 5A show positions of those holes through which the cooling gas is supplied in the etching apparatus shown in FIG. 1.
Figure 4B:
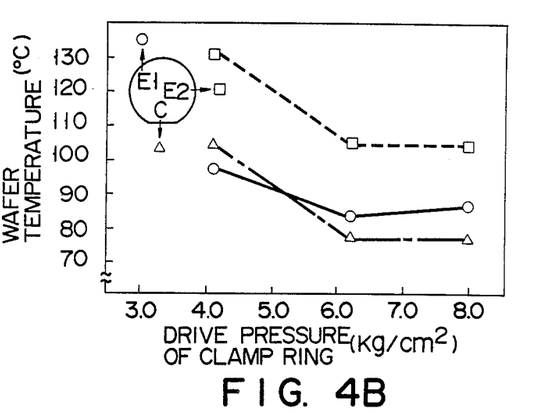
FIGS. 4B and 5B are graphs showing the relation between wafer temperature and clamp-driving pressure.
Figure 5A:
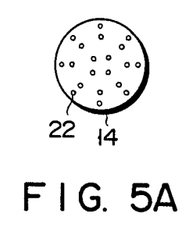
Figure 5B:
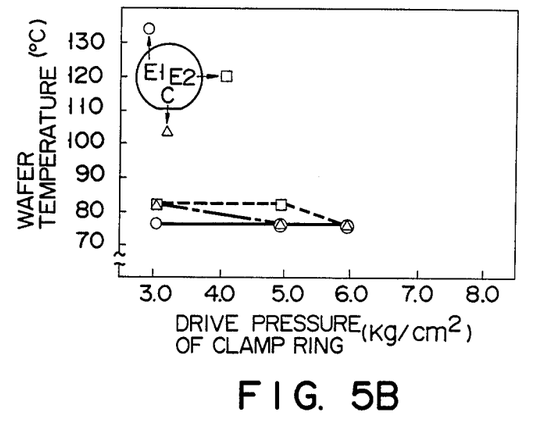

This uniformity of etching is influenced by the force of clamp ring 15 with which semiconductor wafer 13 is pressed at the periphery rim portion thereof and also by the position of openings 22 on the surface of lower block electrode 14. When four openings 22 are arranged at the center of the surface of lower block electrode 14, as shown in FIG. 4A, the characteristic of semiconductor wafer 13 is as shown in FIG. 4B. When four openings 22 are arranged at the center of lower block electrode 14 and other sixteen openings 22 at the peripheral rim portion thereof, as shown in FIG. 5A, the characteristic of semiconductor wafer 13 is as shown in FIG. 5B. It was assumed in FIGS. 4B and 5B that the pressure or vacuum degree in reaction container 1 was 2.4 Torr, output of RF power source 26 500 W, flow rate of freon gas which served as the reaction gas was 80 cc/min, flow rate of argon gas 500 cc/min, temperature of upper electrode 7 20° C., and temperature of lower block electrode 14 lower than 8° C. The flow rate and pressure of cooling gas for lower block electrode 14 was changed from 2 cc/min and 10 Torr in FIG. 4A to 5 cc/min and 7.5 Torr. Temperature was measured at one point C in the center and other two points $E_1$ and $E_2$ in the peripheral rim portion on the surface of semiconductor wafer 13 while changing the driving pressure of clamp ring 15. As apparent from FIGS. 4B and 5B, the temperature distribution of semiconductor wafer 13 becomes more uniform when openings 22 are also arranged at the peripheral rim portion of lower block electrode 14. Further, it is found that temperature becomes equal at points C, $E_1$ and $E_2$ on semiconductor wafer 13 when the set pressure of clamp ring 15 is 6.0 kg/cm$^2$.

It can be prevented by the supply of cooling gas, as described above, that semiconductor wafer 13 is heated by plasma generated to reduce the uniformity of etching. The temperature distribution of semiconductor wafer 13 can be made certain by this supply of cooling gas to enhance the uniformity of etching.

Gas in reaction container 1 after the etching process and air in reaction container 1 at the time when semiconductor wafer 13 is to be conveyed into reaction container 1 are appropriately exhausted to the exhaust means (not shown), which is located outside the reaction container 1, through hole 27 in exhaust ring 28 and exhaust pipe 29.

Although four openings have been arranged in the center of the lower block electrode while locating other sixteen openings at the peripheral rim portion thereof to supply cooling gas to the underside of the semiconductor wafer through these openings, the number of these openings is not limited to the above. Further, the supply of cooling gas has also been carried out through those four openings in the center of the lower block electrode in which the lifter pins are housed, but these four openings in the center of the lower block electrode may be formed independently of those ones in which the lifter pins are housed.

According to the etching apparatus as described above, the flow rate and pressure of cooling gas supplied to the clearance between the substrate to be processed and the lower block electrode on which the substrate is mounted can be controlled to cool the substrate, so that temperature can be made equal at every point on the substrate to enhance the uniformity of etching. Further, the pressure and flow rate of cooling gas can be controlled to be desired values by monitoring the pressure and flow rate of cooling gas. Furthermore, even when the supply of cooling gas is stopped by accident, it can be detected and conquered to prevent the productivity of the semiconductor wafers from being reduced.

Figure 6:
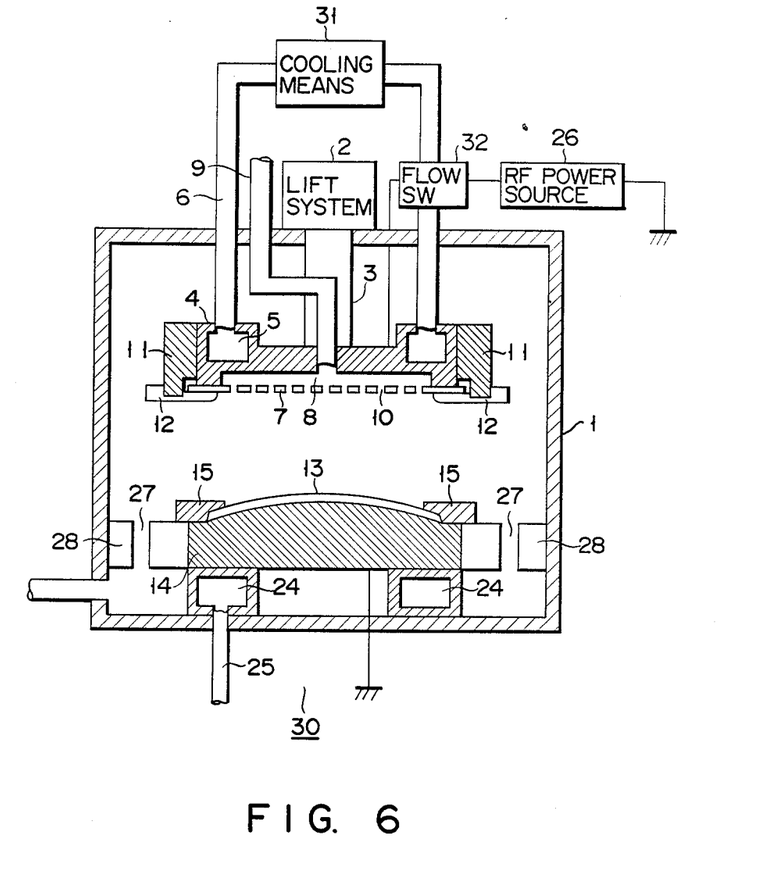
FIG. 6 shows an arrangement of the means for stopping the generation of plasma.

The upper electrode is cooled by cooling means 31 in the case of the above-described etching apparatus. As shown in FIG. 6, it may be arranged in this case that a means for detecting poor cooling or flow switch 32 is located on pipe 6 to detect whether or not the flow rate of the cooling water which flows through pipe 6 is in a range of set values or whether or not the cooling water flows through pipe 6 and that a means is provided to stop the generation of plasma when the flow rate of the cooling water is not in the range of set values or when the cooling water does not flow through pipe 6. The means for stopping the generation of plasma is formed in such a way that whether or not the flow rate of the cooling water is equal to a set value or in the range of set values is detected by flow switch 32 and that when it is not equal to the set value or in the range of set values, flow switch 32 is opened to shut off electric current applied from RF power source so as to stop plasma discharge needed for the etching process.

The forced air cooling system in which air is cooled and circulated, the natural air cooling system which uses radiating fins contacted with block electrode 4, or the electric cooling system in which Peltier effect elements are arranged in block electrode 4 may be employed instead of the liquid cooling system in which a cooled and controlled liquid is used. The flow rate of air is monitored to detect poor cooling in the case of the forced air cooling system. The temperature of block electrode 4 is monitored to detect poor cooling in the case of the natural air cooling system. The temperature of cooling elements or electric current supplied is monitored to detect poor cooling in the case of the electric cooling system. Same effect can be achieved in any case.

Lower block electrode 14 and upper electrode 7 are connected to RF power source 26 with flow switch 32 interposed between upper electrode 7 and RF power source 26. When flow switch 32 detects the poor cooling of upper electrode 7, electric current supplied from RF power source 26 is shut off.

Upper electrode 7 and lower block electrode 14 are cooled as described above to achieve a stable etching process. When the cooling of upper electrode 7 is poor, however, upper electrode 7 is cracked and the temperature of semiconductor wafer 13 is changed by radiant heat to reduce the productivity of semiconductor wafers. This is the reason why flow switch 32 is located on pipe 6, as the means for detecting the poor cooling of block electrode 4, to detect whether or not the flow rate of the cooling water which flows through pipe 6 is in a range of set values or whether or not the cooling water flows through pipe 6. This is also the reason why another means is provided to stop the generation of plasma when the flow rate of the cooling water is not in the range of set values. According to this means for stopping the generation of plasma, the above-mentioned detection is carried out by flow switch 32 and when the flow rate of the cooling water is not equal to a set value or in the range of set values, flow switch 32 is opened to shut off electric current supplied from RF power source 26 so as to stop plasma discharge needed for the etching process. This stop of current supply prevents upper electrode 7 from being cracked. It also prevents semiconductor wafer 13 from being subjected to any undesirable influence in the course of the etching process. The stop of the etching process may be informed to operators by alarm sound or display.

The flow switch has been used as the means for detecting poor cooling in the etching apparatus shown in FIG. 6 and it has been detected by this flow switch whether or not the flow rate of the cooling water which flows through the pipe is in a range of set values or whether or not the cooling water flows through the pipe. However, the detecting system of poor cooling is not limited to this. It may be arranged that a temperature detecting means such as the thermistor thermocouple and thermograph is attached to the block electrode or upper electrode and that the temperature of the block electrode or upper electrode is monitored by this means to stop the generation of plasma when the temperature is not in a range of set values.

The etching apparatus of the present invention can be applied to the CVD apparatus, ion injection apparatus, sputtering apparatus and the like to achieve same effect as described above.

According to the etching apparatus shown in FIG. 6, the block electrode provided with an upper electrode which is opposed to another lower block electrode on which a substrate to be processed is mounted is cooled by the cooling means and when the poor cooling of the block electrode is detected by the detector means, the generation of plasma or supply of electric current is stopped to prevent the block electrode and upper electrode from being abnormally heated by current supplied. When the abnormal heating is stopped like this, it can be prevented that the upper electrode made of such a material that is quite different from the material of the block electrode in thermal expansion coefficient is cracked by the thermal expansion of the block electrode, thereby enabling the durability of the etching apparatus to be enhanced. When the abnormal heating is stopped and the temperature of the upper electrode is controlled by the cooling means, the temperature of the substrate to be processed can be kept certain, giving no undesired influence to the etching process.

What is claimed is:

1. An etching apparatus wherein electrodes are arranged in a vacuum container, a process gas in the vacuum container is changed to plasma by electric current applied to the electrodes, and a substrate mounted on the electrode is etched by the plasma of the process gas, said apparatus comprising:
   a means for cooling the electrodes, a means for detecting if the cooling of the electrodes is below a desirable limit, and
   a means for stopping the drive of the plasma generator, in response to a detection signal supplied from the detector means.

2. The etching apparatus according to claim 1, wherein the electrode cooling means includes a means for supplying a cooling gas into a clearance formed between at least the substrate and the electrode on which the substrate is mounted, and a means for controlling the flow rate and pressure of the cooling gas to desired values.

3. An etching method comprising the steps of:
   mounting a substrate to be processed on one of a plurality of electrodes which are arranged in a vacuum container,
   supplying a cooling gas to the electrode, on which the substrate is mounted, at predetermined flow rate and pressure,
   applying electric current to the electrodes to change a process gas to plasma by stopping the generation of plasma due to the electrodes when the cooling of the electrodes is detected as being below a desirable limit, and
   etching the substrate by the plasma of the process gas.

4. The etching method according to claim 3, wherein the cooling gas supply process includes a step of controlling the flow rate and pressure of the cooling gas.

* * * * *